United States Patent
Gong et al.

(10) Patent No.: US 7,790,983 B2
(45) Date of Patent: Sep. 7, 2010

(54) USER-MANIPULATED DOOR MECHANISM FOR SELECTIVELY COVERING AN ELECTRICAL SOCKET

(75) Inventors: Yuhong Gong, Shanghai (CN); Xin Wang, Shanghai (CN); Qin Zhang, Shanghai (CN)

(73) Assignee: Delphi Technologies, Inc., Troy, MI (US)

( * ) Notice: Subject to any disclaimer, the term of this patent is extended or adjusted under 35 U.S.C. 154(b) by 440 days.

(21) Appl. No.: 11/890,037

(22) Filed: Aug. 3, 2007

(65) Prior Publication Data

US 2009/0032279 A1    Feb. 5, 2009

(51) Int. Cl.
*H05K 5/03* (2006.01)
(52) U.S. Cl. ............................ 174/67; 174/66; 220/241; 220/242; 361/616; 361/679.02; 439/536
(58) Field of Classification Search .................... 174/66, 174/67, 135, 521, 50, 17 R, 53, 57, 58; 220/3.2–3.9, 220/4.02, 241, 242; 361/679.01, 679.02, 361/616, 672; 439/535, 536, 142, 892
See application file for complete search history.

(56) References Cited

U.S. PATENT DOCUMENTS

| 4,342,493 | A  | * | 8/1982  | Grenell ........................ 439/892 |
| 5,501,607 | A  | * | 3/1996  | Yoshioka et al. ............. 220/3.8 |
| 5,779,083 | A  | * | 7/1998  | Bordwell ..................... 174/67 |
| 6,265,662 | B1 | * | 7/2001  | Riedy et al. .................... 174/67 |
| 6,378,173 | B1 | * | 4/2002  | Ho et al. ...................... 220/241 |
| 6,417,450 | B1 | * | 7/2002  | Young ......................... 174/66 |
| 7,276,662 | B2 | * | 10/2007 | Drane .......................... 174/66 |
| 7,375,279 | B2 | * | 5/2008  | Chen ........................... 174/66 |
| 2004/0212966 | A1 |   | 10/2004 | Fisher et al. |
| 2006/0148578 | A1 |   | 7/2006  | Hayes et al. |

* cited by examiner

*Primary Examiner*—Angel R Estrada
(74) *Attorney, Agent, or Firm*—Jimmy L. Funke

(57) ABSTRACT

A user-manipulated door mechanism is mounted on the faceplate of an electronic module for allowing user access to an electrical socket disposed inboard of a faceplate aperture. An inwardly extending rectangular shoulder formed along one edge of the door is rotatably mounted about an axis inboard of the faceplate, and is resiliently engaged by the free end of a cantilevered spring blade inboard of the faceplate. The spring blade engages a first face of the shoulder that is substantially parallel to the door when the door is in a closed position covering the socket, and a second face of the shoulder that is substantially perpendicular to the door when the door is in an open position uncovering the socket.

4 Claims, 1 Drawing Sheet

USER-MANIPULATED DOOR MECHANISM FOR SELECTIVELY COVERING AN ELECTRICAL SOCKET

TECHNICAL FIELD

The present invention relates to an electronic module having a faceplate and an electrical socket that is recessed with respect to the faceplate, and more particularly to a door mechanism that is selectively closed to cover the socket and opened to access the socket.

BACKGROUND OF THE INVENTION

The desirability of providing a door or cover for an electrical socket (a USB connector, for example) of an electronic module is generally recognized. In some cases, the cover is an elastomeric plug that is removed to access the socket; in other cases, the cover is in the form of a hinged door that covers the socket when closed and allows access to the socket when open. See, for example, the U.S. Patent Application Publication Nos. 2004/0212966A1 and 2006/0148578A1. What is needed is a simple and inexpensive door mechanism.

SUMMARY OF THE INVENTION

The present invention is directed to a user-manipulated door mechanism mounted on the faceplate of an electronic module for selectively allowing user access to an electrical socket disposed inboard of a faceplate aperture. The door mechanism includes a door panel for selectively closing the faceplate aperture, a rectangular shoulder extending inwardly from one edge of the door panel, and a cantilevered spring blade disposed inboard of the faceplate. The shoulder is rotatably mounted about an axis inboard of the faceplate, and is resiliently engaged by the free end of the cantilevered spring blade to resist movement between the open and closed positions of the door panel. When the door panel is in a closed position covering the socket, the spring blade engages a first face of the shoulder that is substantially parallel to the door panel. When the door panel is in an open position uncovering the socket, the spring blade engages a second face of the shoulder that is substantially perpendicular to the door panel.

DESCRIPTION OF THE PREFERRED EMBODIMENT

Figure 3:
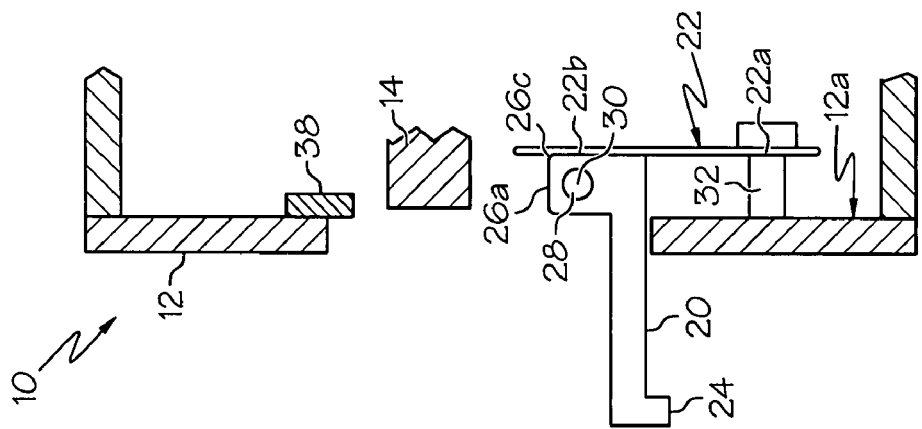
FIG. 3 is a diagram of the door mechanism of FIG. 1 with the door in an open position.

Referring to the drawings, the reference numeral 10 generally designates an electronic module such as a car radio. The module 10 includes a faceplate 12 and an electrical socket 14 such as a USB connector or a memory card socket, that is recessed with respect to the faceplate 12 in alignment with a faceplate aperture 16. The reference numeral 18 generally designates a door mechanism that is affixed to faceplate 12 to protect the socket 14 from exposure to foreign matter such as dust when not in use.

Figure 1:
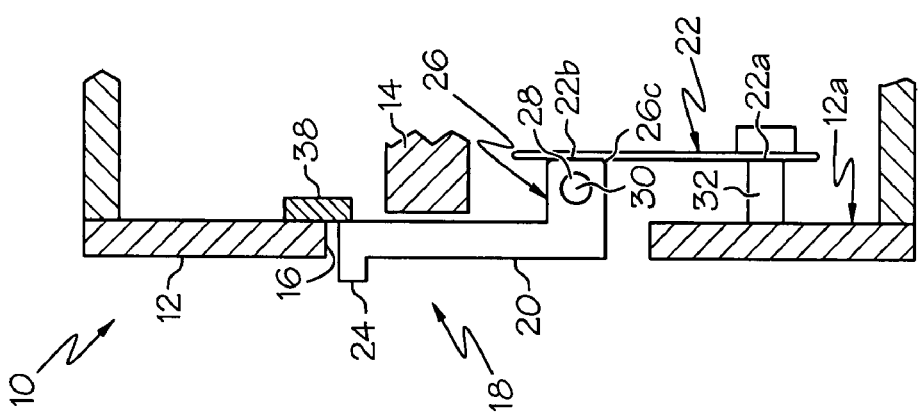
FIG. 1 is a diagram of a door mechanism according to this invention, with the door in a closed position.

Door mechanism 18 includes a door panel 20 for selectively closing the panel aperture 16 as illustrated in FIG. 1 and a cantilevered spring blade 22. An outwardly extending horizontally lip 24 formed along the upper edge of door panel 20 is provided for user manipulation of the door panel 20, and an inwardly extending rectangular shoulder 26 formed along the lower edge of door panel 20 is provided for mounting door panel 20 with respect to the faceplate 12. The module 10 includes a pin 28 having a horizontal axis 30 inboard of the faceplate 12, and the pin 28 extends through an opening formed in the shoulder 26 to permit rotation of the door panel 20 with respect to axis 30. The spring blade 22 is secured at one end 22a to a post 32 extending out of the inboard face 12a of faceplate 12 such that its free end 22b resiliently engages the shoulder 26 when mounted on pin 28 for rotation about the axis 30.

Figure 2:
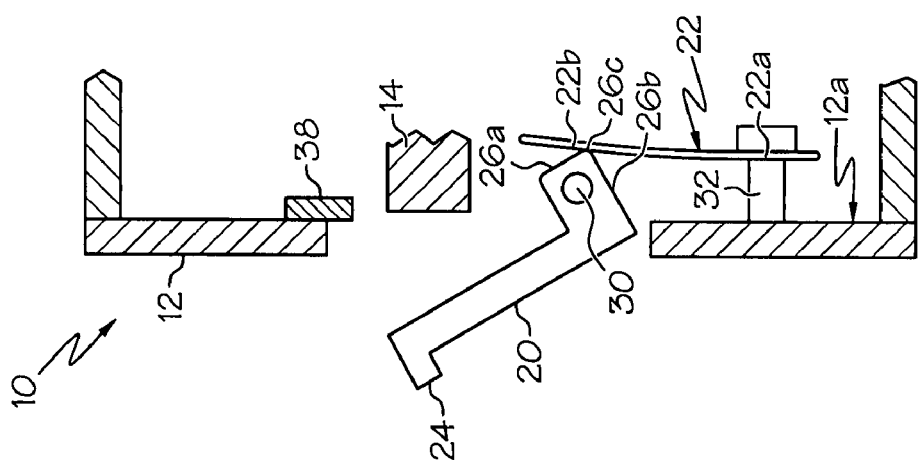
FIG. 2 is a diagram of the door mechanism of FIG. 1 with the door partially opened.

Resilient engagement of the spring blade 22 with the shoulder 26 establishes two detent positions of the door panel 20, with resistance to door panel movement between the two detent positions. The first detent position, depicted in FIG. 1, occurs when the door panel 20 is fully closed and the free end 22b of spring blade 22 engages a first face 26a of shoulder 26 that is substantially parallel to the door panel 20. The second detent position, depicted in FIG. 3, occurs when the door panel 20 is fully open and the free end 22b of spring blade 22 engages a second face 26b of shoulder 26 that is substantially perpendicular to the door panel 20. Intermediate the open and closed positions of door panel 20, the spring blade 22 engages a corner 26c of the shoulder 26 joining the first and second faces 26a-26b as depicted in FIG. 2 and deflects inwardly to provide a restoring force or torque that urges the door panel 20 toward the open or closed positions. Optionally, a mechanical stop 38 can be provided for limiting inward movement of the upper edge of the door panel 20.

In summary, the door mechanism of the present invention provides a simple and inexpensive way of protecting the electrical socket of a module when not in use while allowing convenient access to the socket when its use is desired. While the door mechanism has been described with respect to the illustrated embodiment, it is recognized that numerous modifications and variations in addition to those mentioned herein will occur to those skilled in the art. For example, the shoulder 26 may be provided on the top or side of the door panel 20 instead of the bottom, and so forth. Accordingly, it is intended that the invention not be limited to the disclosed embodiment, but that it have the full scope permitted by the language of the following claims.

The invention claimed is:

1. Apparatus for selectively covering and uncovering an electrical socket aligned with an aperture in a faceplate of an electronic module, comprising:

a user-manipulated door having a closed position for covering said socket and an open position for uncovering said socket, said door including a panel that closes said aperture in the closed position and a shoulder that extends inward substantially perpendicular to said panel, said shoulder being supported for rotation about an axis disposed inboard of said faceplate; and a cantilevered spring blade disposed inboard of said faceplate, said spring blade having a first end that is supported with respect to said faceplate and a second end that resiliently engages said shoulder so as to resist movement of said user-manipulated door from both said closed position to said open position, and said open position to said closed position.

2. The apparatus of claim 1, where:

said shoulder has a rectangular periphery including a first planar face substantially parallel to said panel and a second planar face substantially perpendicular to said panel; and said second end of said cantilevered spring blade engages the first planar face of said shoulder when said door is in the closed position, and the second planar face of the shoulder when the door is in the open position.

3. The apparatus of claim 2, where:

said second end of said cantilevered spring blade engages a corner of the shoulder joining said first and second planar faces when said door is between the open and closed positions.

4. The apparatus of claim 1, where:

the first end of said cantilevered spring blade is affixed to a post inboard of said faceplate.

\* \* \* \* \*